(12) United States Patent
Yu

(10) Patent No.: US 8,463,584 B2
(45) Date of Patent: Jun. 11, 2013

(54) INTERACTIVE FILLING SIMULATION ON 3D INJECTION MOLDING MODELS

(75) Inventor: Huagang Yu, Templestowe (AU)

(73) Assignee: Autodesk, Inc., San Rafael, CA (US)

( * ) Notice: Subject to any disclaimer, the term of this patent is extended or adjusted under 35 U.S.C. 154(b) by 451 days.

(21) Appl. No.: 12/874,949

(22) Filed: Sep. 2, 2010

(65) Prior Publication Data
US 2012/0059637 A1    Mar. 8, 2012

(51) Int. Cl.
*G06F 9/455* (2006.01)

(52) U.S. Cl.
USPC .............................. 703/9; 700/197; 700/200

(58) Field of Classification Search
USPC ........... 703/9, 1; 700/197, 118, 200; 425/145; 419/6; 706/15; 293/102; 705/26; 264/219
See application file for complete search history.

(56) References Cited

U.S. PATENT DOCUMENTS

| | | | | |
|---|---|---|---|---|
| 5,609,374 A * | 3/1997 | Sawae et al. | | 293/102 |
| 5,937,265 A * | 8/1999 | Pratt et al. | | 419/6 |
| 6,096,088 A * | 8/2000 | Yu et al. | | 703/9 |
| 6,161,057 A * | 12/2000 | Nakano | | 700/197 |
| 2002/0188375 A1* | 12/2002 | Shioiri et al. | | 700/200 |
| 2004/0047935 A1* | 3/2004 | Moss et al. | | 425/145 |
| 2005/0125092 A1* | 6/2005 | Lukis et al. | | 700/197 |
| 2009/0125418 A1* | 5/2009 | Lukis et al. | | 705/26 |
| 2009/0271156 A1* | 10/2009 | Kageura | | 703/1 |
| 2009/0289391 A1* | 11/2009 | Tye et al. | | 264/219 |
| 2009/0319454 A1* | 12/2009 | Regli et al. | | 706/15 |
| 2010/0036646 A1* | 2/2010 | Hisai et al. | | 703/1 |
| 2010/0222914 A1* | 9/2010 | Tye et al. | | 700/118 |

FOREIGN PATENT DOCUMENTS
CN    101118569 A    2/2008

OTHER PUBLICATIONS

Marcilla et al., "Simulation of the gas assisted injection molding process using a mid-plane model of a contained channel part", Journal of materials processing technology, 2006.*
International Search Report and Written Opinion from International Application No. PCT/US2011/050264, mailed Feb. 22, 2012, 13 pages.
Naitove, M.H. "New mold-analysis software for beginners & sophisticated users" Plastics Technology, Aug. 1, 1993, [retrieved on Jan. 26, 2012] Retrieved from the Internet: <URL: http://thefreelibrary.com/New+mold-analysis+software+for+beginners+%26+sophisticated+users.-a015502123>, 3 pages.
Pandelidis, I. "Optimization of injection molding design. Part II: Molding conditions optimization", Polymer Engineering and Science, vol. 30, No. 15, Aug. 1990, pp. 883-892.
Zhao, P., et al., "Process parameters optimization of injection molding using a fast strip analysis as a surrogate model", The International Journal of Advanced Manufacturing Technology, vol. 49, No. 9-12, Nov. 28, 2009, pp. 949-959.

* cited by examiner

*Primary Examiner* — Kandasamy Thangavelu
(74) *Attorney, Agent, or Firm* — Fish & Richardson P.C.

(57) ABSTRACT

Methods, systems, and apparatus, including computer programs encoded on a computer storage medium, for interactively simulating an injection mold model. A three-dimensional CAD model is identified representing an injection mold cavity. The mold cavity includes a location of at least one gate. A potential fill pattern is determined for injection of a material into the injection mold cavity. The determined fill pattern is based at least in part on the geometry and dimensions of the modeled mold cavity and the location of the at least one gate. A strip model of the CAD model is generated based at least in part on the determined fill pattern. The strip model is used to perform a strip analysis simulating injection of the material within the injection mold cavity.

22 Claims, 10 Drawing Sheets
(6 of 10 Drawing Sheet(s) Filed in Color)

200

205 IDENTIFY 3D CAD MOLD CAVITY MODEL

210 PARTITION CAD MOLD CAVITY MODEL

215 DETERMINE FILL PATTERN FOR MODEL

220 GENERATE STRIP SEGMENT MODEL

225 PERFORM STRIP ANALYSIS ON STRIP SEGMENT MODEL

705 RECEIVE USER INPUT IDENTIFYING MODIFICATION

710 DETERMINE UPDATED FILL PATTERN

715 DETERMINE UPDATED STRIP SEGMENT MODEL

720 PERFORM STRIP ANALYSIS ON UPDATED STRIP SEGMENT MODEL

FIG. 7

INTERACTIVE FILLING SIMULATION ON 3D INJECTION MOLDING MODELS

BACKGROUND

The present disclosure relates to computer-implemented production simulations, including simulations of injection molding.

Injection molding is a common manufacturing method in modern industry. In a typical injection molding application, thermoplastic, thermosetting, or elastomer material is heated and melted and then piped or injected under pressure into the voids of an empty die or mold. The molten material injected into the mold is then cooled so as to permanently harden in the shape of the hollow mold cavity. The cooled and set material is then removed from the mold, forming the near finished product, piece, or part in the shape of the mold. Injection molding can be an efficient method of production in that it typically allows manufacturers to reuse one or more dies and reproduce, with precision, the products formed in the die. Typically, the initial design and manufacture of the mold is quite costly. Much is invested to design and perfect a mold that will be re-used, in some instances, millions of times over the course of its life. Consequently, injection molding is often characterized by high efficiencies of scale, the return on investment for a particular die dependent on the durability and lasting precision of the die. As a result, typical injection mold cavity design is at the same time a critically important, but difficult and costly process.

Thousands of polymer materials exist capable of being used in injection molding applications. In some instances, the material that is to be used in an injection molding application can even influence the design of a given mold cavity and vice versa. For instance, some high viscosity materials, in their molten form, may perform poorly in a mold cavity machined with narrow gates, runners, and cavity voids. Additionally, the geometry of the mold cavity can also influence the physical properties of plastic parts manufactured using the mold. Indeed, two parts having identical dimensions and made from the same thermoplastic material but molded under different conditions, with different gate locations, for instance, can possess different stress and shrinkage levels. As a consequence, mold cavity engineers often seek to optimize a mold cavity design in order to produce the most commercially-acceptable product.

SUMMARY

This specification describes a number of methods, systems, and programs that interactively simulate injection of material into modeled mold cavities, based on a strip segment model generated for the respective modeled mold cavity. A potential fill pattern for a material injected into a modeled injection mold cavity can be determined based at least in part on the geometry and dimensions of the modeled mold cavity and the location of at least one gate of the mold cavity. A strip segment model can be generated for the modeled mold cavity based at least in part on the determined fill pattern. The strip segment model can be used to perform a strip analysis corresponding to the modeled mold cavity and simulating injection of the material within the mold cavity. In some instances, results of the strip analysis can be generated and presented to the user. For example, strip analysis results can be mapped onto the modeled mold cavity for use by a mold cavity or part designer.

Particular embodiments of the subject matter described in this specification can be implemented to realize one or more of the following advantages, including substantially decreasing the time and resources necessary to generate a set of injection mold simulation results. Simulating injection molding typically requires hours of human engineering and computing hours. With a "quick" mold cavity simulation using one or more computer-generated strip segment model of a three-dimensional mold cavity, interactive simulations can additional be realized, allowing a mold cavity or part designer to consider and test several design alternatives. Additionally, given the speed at which quick injection molding simulation results can be generated, iterative and concurrent simulations can be run, in some examples, to approximate optimum design features or select an optimum mold cavity design from a plurality of mold cavity models. Empowering an injection cavity mold or part designer with such functionality can further assist in developing well-designed real world parts and molds, limiting the risks of developing flawed production molds, and speeding up the design cycle. Additionally, the interactive simulation tool can speed up in-depth analyses by producing higher quality prototypes and reducing the number of in-depth trial iterations.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2 is a flow-diagram of an example technique for performing a filling simulation of a three-dimensional injection mold cavity model.

FIG. 7 is a flow-diagram of an example technique for interacting with injection molding simulation tool.

Like reference numbers and designations in the various drawings indicate like elements.

DETAILED DESCRIPTION

An injection molding simulator can model and predict the performance and dynamics of a hypothetical injection molding equipment as it injects a particular thermoplastic material into a particular mold cavity. The shape of the mold cavity as well as the polymer material used in the simulation can result in a particular, predicted result. Typically, simulating and analyzing the simulation of filling a particular mold cavity with a particular material and analyzing the results of the simulation can require hours of processing and work performed by computers and engineers. An in-depth simulation and analysis of the performance of a particular injection molding design can involve complex and intensive calculations and processing, demanding for even the fastest, modern computing systems. As a result, engineers typically wait until a design has been fine-tuned and finalized to a particular degree before performing in-depth computer simulations of the design. Additionally, simulations of a design can reveal flaws in the design requiring hours of engineering and labor above and beyond what was required to produce the original design as well as carry out simulation of the design. While in-depth computer simulations of an injection mold cavity design may still be desired in some instances, a "quick" simulation of an injection mold cavity can be performed using a quick simulation algorithm. Given modern computing capabilities, a quick injection molding simulation can be performed in microseconds, providing near instantaneous performance approximations for a given injection mold cavity design. Given the speed of these quick simulations, a quick simulator can be integrated in or otherwise used with a computer-aided injection mold modeling and design tool to allow an engineer or other user to interactively analyze and simulate effects of particular design decisions. A user can use the quick simulation tool to iteratively design a semi-optimized mold cavity model ready for more in-depth (and expensive) analyses, modeling, and/or prototyping.

Figure 1:
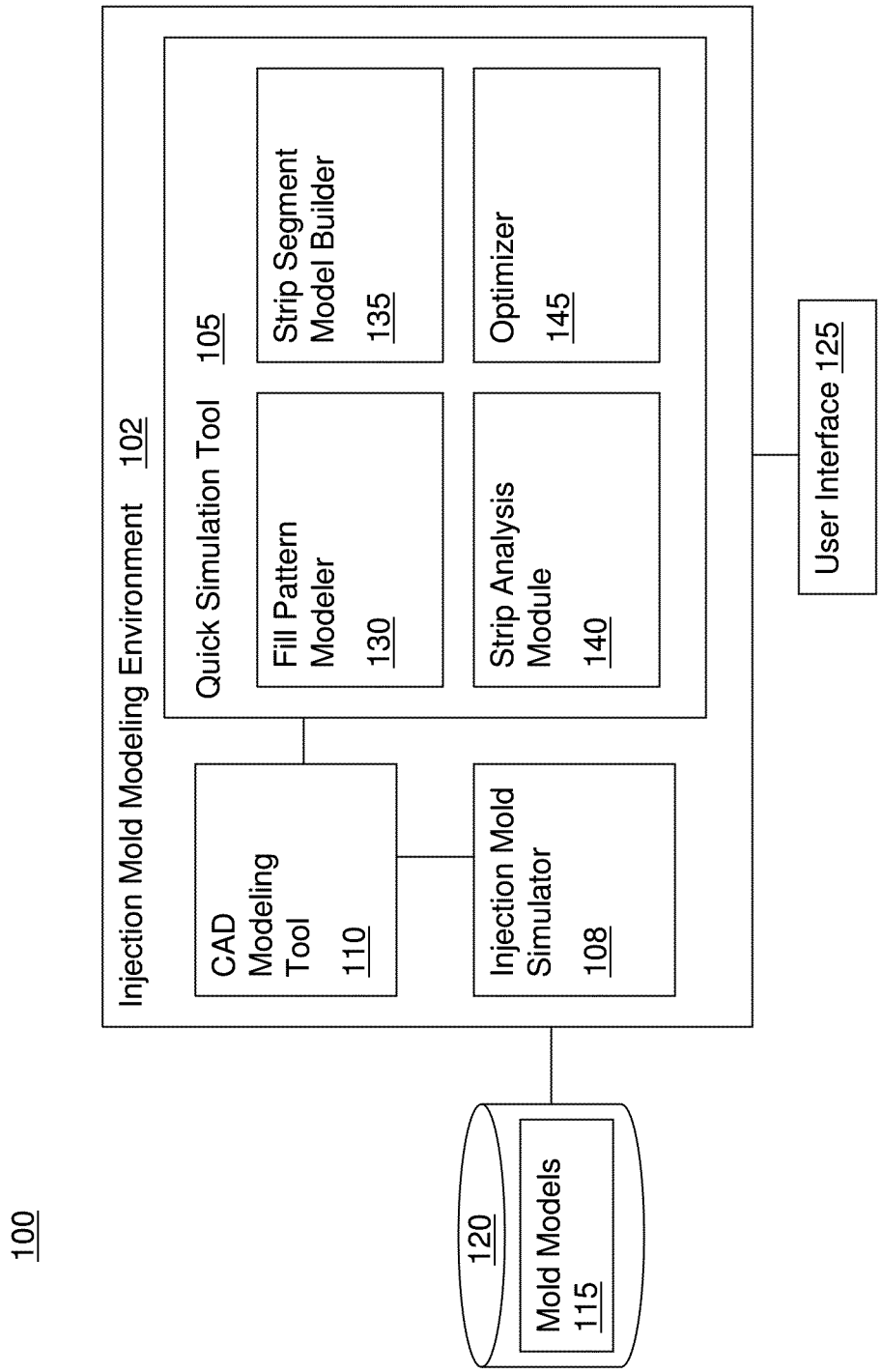
FIG. 1 is a schematic diagram of an example system for performing interactive filling simulations of a three-dimensional injection mold cavity model.

FIG. 1 is a schematic diagram of an example system 100 for performing interactive filling simulations of a three-dimensional injection mold cavity model. The system 100 can include an injection mold modeling environment 102 that includes a quick simulation tool 105 adapted to provide quick simulations and analyses of a three-dimensional CAD model of an injection mold cavity. In some instances, the modeling environment can additionally include an injection molding simulator 108 adapted to run in-depth, detail flow analyses, such as a full Hele-Shaw flow analysis, midplane analysis, or duo domain analysis. The injection molding simulator 108 can be used to prepare a final, pre-production flow analysis for a completed mold cavity model. The modeling environment 102 can further include a CAD modeling tool 110 adapted to allow users to build, design, engineer, edit, display, visualize, and store CAD injection mold cavity models. Some commercially-available CAD modeling tools include Autodesk™ Moldflow™'s Insight™, Advisor™, Autodesk™ Inventor™, Solidworks™, and ProEngineering™ products. Models developed or modified using the CAD modeling tool 110 can be simulated and analyzed using the quick simulation tool 105 and/or injection molding simulator 108. Indeed, in some implementations, one or more of the quick simulation tool 105 and injection molding simulator 108 can be integrated in, interface with, or otherwise function in connection with the CAD modeling tool 110. In some instances, pre-existing injection mold cavity models 115 can be stored in one or more memory devices 120 internal or external to the modeling environment 102. In some instances, one or more memory devices 120 can be remote from computing devices, servers, and systems implementing the modeling environment 102. Remote memory devices can be communicatively coupled to the modeling environment using one or more networks, including private and public networks, including the internet. Additionally, one or more interactive user interfaces 125 can be provided allowing users to provide inputs to and receive outputs from the modeling environment 102. User inputs and feedback can be directed to either or both of the CAD modeling tool 110 and quick simulator tool 105. Similarly, outputs of one or both of the CAD modeling tool 110 and quick simulator tool 105 can be presented to the user through a user interface 125. User interfaces can be implemented as computing devices local to or remote from the modeling environment 102. As one example, the modeling environment 102 can be provided as a distributed, online, or cloud computing system accessible by multiple remote client computing devices and user interfaces 125. In other examples, all or part of the modeling environment can be implemented locally in the memory of a personal computing device including a local user interface 125.

In some instances, quick simulation tool 105 can include one or more modules implementing functionality of the quick simulation tool 105. For instance, a quick simulation tool 105 can include functionality for performing a quick filling simulation analysis according to an algorithm that include modeling a potential flow pattern of material injected into a mold cavity, using the calculated flow pattern to automatically build a simplified strip segment model of the mold cavity volume, and performing a strip analysis on the strip segment model to obtain certain analysis results based on the simplified strip segment model. For instance, analysis results can be generated and mapped onto a 3D CAD model based on the analysis of the strip segment model, for use by developers in identifying potential problems with a particular mold design, including short shot, unbalanced flow, sink marks, air trips, and undesirable locations of weld lines. Accordingly, in one example of a quick simulation tool 105, the quick simulation tool 105 can include flow pattern modeler 130, a strip segment model builder 135, and a strip analysis module 140. In some instances, a quick simulation tool can further include an optimizer 145 adapted to perform optimization calculations on a simplified model, such as a strip segment model, generated by the quick simulation tool 105. For instance, an optimizer module 145 can determine the approximate location of a mold cavity gate on a particular mold cavity model, based on a simplified strip segment model of the mold cavity, that would yield optimized performance results for injection molding of a particular material within the model.

The quick simulation model 105 and system 100, as shown in FIG. 1, is but one illustrative example of implementations of the concepts and features described herein. For instance, while FIG. 1 is described as containing or being associated with a plurality of elements, not all elements illustrated within environment 100 of FIG. 1 may be utilized in each alternative implementation of the present disclosure. Additionally, one or more of the elements described herein may be located external to environment 100, while in other instances, certain elements may be included within or as a portion of one or more of the other described elements, as well as other elements not described in the illustrated implementation. Further, certain elements illustrated in FIG. 1 may be combined with other components, as well as used for alternative or additional purposes in addition to those purposes described herein.

FIG. 2 is a flow-diagram of an example technique for performing a filling simulation and analysis of a three-dimensional injection mold cavity model. In one example, a three-dimensional CAD model representing an injection mold cavity can be identified 205. The CAD model can include a specified location for at least one gate on the mold. The gate location(s) can be specified by a user or generated by an optimization tool, such as an automatic gate locator. An interior volume of the CAD model can be partitioned 210 into a plurality of interconnected, three-dimensional elements or cells. The interior volume can correspond to the injection mold cavity being modeled. In some instances, the interior volume can correspond to a portion of or an approximation of the cavity volume and geometry as a whole. Using the cells that model a volume of the cavity, a potential fill pattern for material injected into the cavity can be determined 215. Determining 215 a potential fill pattern for the cavity can be based on the dimensions and orientations of the plurality of three-dimensional cells, as well as the location of the at least one gate. In other instances, potential fill pattern can be based on other techniques, other than an element mesh model, that determine fill pattern based on the geometry and dimensions of the modeled mold cavity, as well as the location of the at least one gate. In some examples, the physical characteristics of the material to be injected can also be considered (e.g., the material's glass transition temperature, melting temperature, viscosity, viscoelasticity, rheological, thermal, mechanical, shrinkage, optical, and environmental properties), although in other examples, a generic material model modeling a thermoplastic material with genericized properties can be applied. Using the calculated potential fill pattern, a simplified strip segment model of the three-dimensional CAD model can be generated 220. An analysis 225 of the performance and properties of material injected within the simplified strip model can be performed to approximate the characteristics and performance of injection molding a real-world implementation of the three-dimensional CAD mold cavity model approximated by the develop strip segment model.

The three-dimensional CAD mold cavity model can be a pre-existing model retrieved from a memory device or be a model currently under development, for example, within a CAD modeling environment. The mold cavity model can be an incomplete model and can model only a portion of an overall mold cavity. In other instances, the mold cavity model can be a complete and/or refined CAD model ready for use in prototyping or manufacturing. Upon identifying 205 a three-dimensional CAD model to be simulated and analyzed, a partitioning of the model can be identified 210. The partitioning data or specifications can be preexisting and integrated or otherwise included in the mold model itself. Indeed, in some instances, a CAD modeling environment used to develop the mold model can specify a partitioning or otherwise subdivide the interior volume of the mold cavity. In other instances, a simulation tool, such as quick simulation tool 105, can partition a model identified 205 for simulation.

Figure 3C:
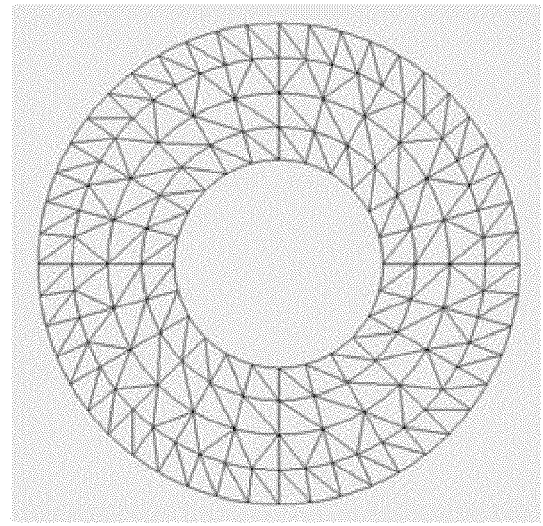
FIG. 3C is an illustration of a third example cell configuration for partitioning a volume of a three-dimensional injection mold cavity model.
Figure 3B:
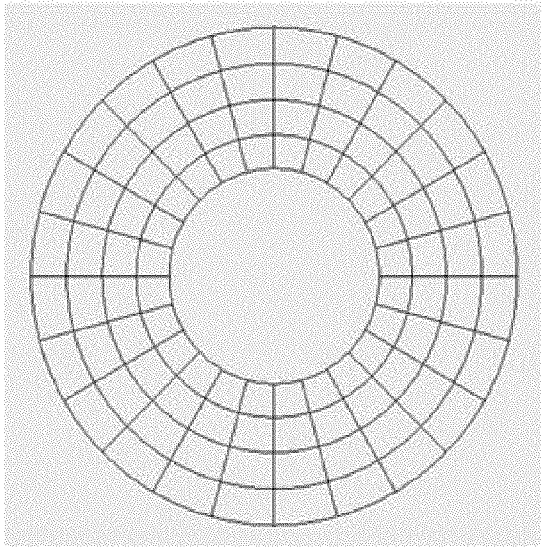
FIG. 3B is an illustration of a second example cell configuration for partitioning a volume of a three-dimensional injection mold cavity model.
Figure 3A:
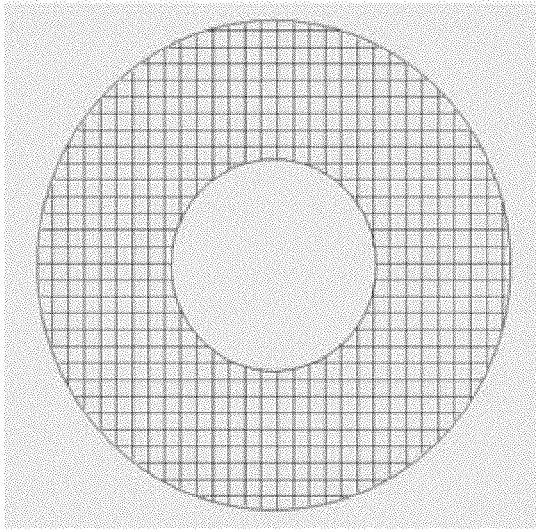
FIG. 3A is an illustration of a first example cell configuration for partitioning a volume of a three-dimensional injection mold cavity model.
Figure 3D:
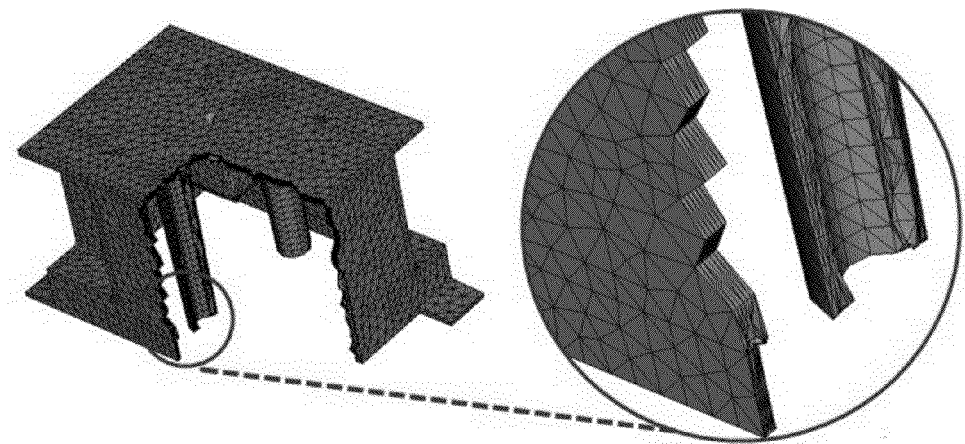
FIG. 3D is an illustration of a fourth example cell configuration for partitioning a volume of a three-dimensional injection mold cavity model.

An interior volume of the mold model corresponding to the injection mold cavity can be subdivided into a plurality of interconnected sub-volumes, cells, voxels, or a three-dimensional grid. The configuration used to partition the model can depend on the numerical method used to determine a potential fill pattern for the model cavity. FIGS. 3A-3D illustrate example configurations for partitioning a volume of a three-dimensional injection mold cavity model. For instance, FIGS. 3A-3C show a cross-sectional view of a mold cavity volume partitioned into a plurality of interconnected sub-volumes. In FIG. 3A, the part geometry is subdivided into a fine grid. The fine grid partitioning of a part can be well-adapted for use in connection with finite difference method (FDM) simulation techniques. FIG. 3B shows an example partitioning of the part into a plurality of small volume cells. Partitioning of a part into small volume cells can prepare a part for simulation using techniques derived from the finite volume method (FVM). FIG. 3C shows the volume partitioned into a plurality of small, simple tetrahedral elements, or "voxels," adapted the volume for simulations using techniques derived from the finite element method (FEM). FIG. 3D shows a perspective view of a part whose volume has been subdivided into a plurality of interconnected tetrahedral elements, or a 3D mesh.

Figure 3E:
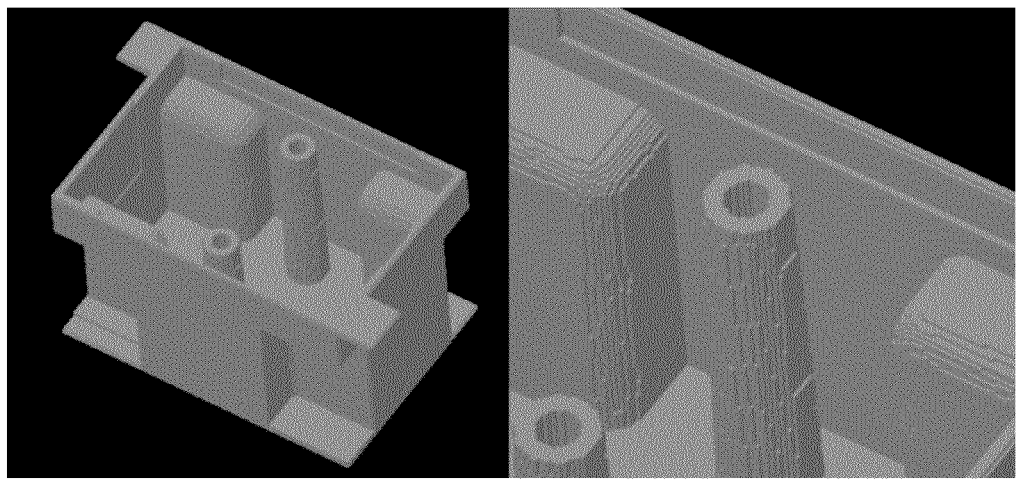
FIG. 3E is an illustration of a fifth example cell configuration for partitioning a volume of a three-dimensional injection mold cavity model.

In another example, FIG. 3E shows a perspective view of a part whose volume has been subdivided into a plurality of interconnected voxels, or a voxel mesh. A voxel ("volume pixel" or "Volumetric Picture Element") is a type of volume cell. Voxels can be quickly generated from a 3D solid model, including CAD models. For instance, a voxel mesh can be generated from 3D solid model by defining a bounding box slightly exceeding the exterior volume and dimensions of the 3D solid model. The bounding box can be filled with a plurality of fine grid of voxels. In some instances, tens of thousands of voxels can be generated to fill the bounding box. Additionally, surface voxels can be identified as those voxels intersecting with the outer surface of the 3D solid model bounded by the box. In some instance, surface voxels can be identified by using OpenGL rendering, although other alternative techniques and algorithms can be used. When identified, the surface voxels form a water tight boundary around the outer surface of the 3D model and separate "inside" voxels from "outside" voxels. The defined inside and surface voxels can be combined to form a suitable voxel mesh. In some instances, using a 4 GB personal computing device with an Intel i7 CPU, a voxel mesh of one half million inside and surface voxels can be generated for a 3D solid model in less than one half second. In addition, due to the simple and uniformly defined connectivity of a voxel mesh, subdividing an interior volume of a 3D model into a voxel mesh can be an efficient and useful technique for use in connection with a quick simulation tool 105.

In some instances, determining a predicted fill pattern for a mold cavity can begin by subdividing the (sometimes complex) geometry of the mold cavity into a plurality of interconnected small and simple geometry entities, such as a voxel mesh. Other mesh and element types and orientations can also be used. With the geometry of the mold cavity subdivided into a mesh, the local thickness of each cell or element can then be calculated. For example, for a midplane mesh, the thickness can be set by the user when the user creates the surface model. For a duo domain mesh, the thickness can be calculated, for instance, using principles described in U.S. Pat. No. 6,096,088 to Yu et al. Further, for examples employing a 3D mesh and/or a voxel mesh, the thickness can be determined for each voxel cell or element by casting a ray perpendicular to the local surface of the geometry of the modeled mold cavity. Other ways of determining the thickness are possible. In some instances, the efficiency of the thickness calculation can be enhanced by first calculating the thickness of certain surface nodes/elements/cells and then using the node/element/cell connectivity of the mesh to progressively calculate local thickness for all nodes/elements/cells in the mesh. For convenience, a node/element/cell can be referred to as "$e^i$," where "i" specifies the index value of the corresponding node/element/cell.

In some instances, determination of the potential fill pattern can be based, at least on the assumption that the injection molded parts (created from an injection mold cavity being modeled) are relatively thin-walled. Flow in the cavity can therefore be modeled to flow within a narrow gap, for instance using principles of Hele-Shaw flow approximations. For instance, assuming that x and y are directions parallel to the mold cavity wall, and z perpendicular, or normal, to the mold cavity wall, with H being the gap of the cavity, plastic melt flow in the cavity can be simplified as:

$$\frac{\partial p}{\partial x} = \frac{\partial}{\partial z}\left(\mu \frac{\partial v_x}{\partial z}\right)$$

$$\frac{\partial p}{\partial y} = \frac{\partial}{\partial z}\left(\mu \frac{\partial v_y}{\partial z}\right)$$

$$\frac{\partial p}{\partial z} = 0$$

where $v_x$, $v_y$ are the velocity components, p is the local pressure, and $\mu$ is the melt viscosity.

The average velocity of the melt across the gap of the cavity can be approximated as:

$$\overline{v} = -\frac{H^2}{12\mu}\Delta p.$$

Figure 4:
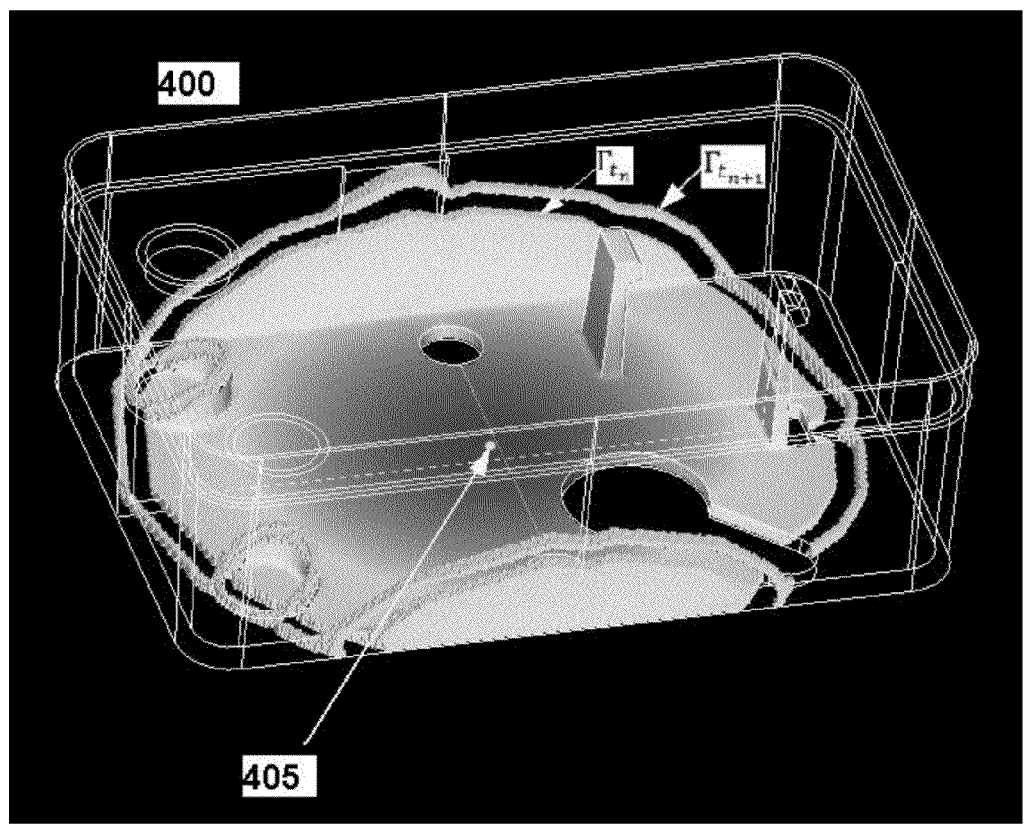
FIG. 4 is an example illustration of a potential fill pattern determined for a three-dimensional injection mold cavity model.

In many instances, the passages of an injection mold cavity will possess varying wall thickness, as in the example illustrated in FIG. 4. For instance, assuming an injection gate location 405 of mold cavity 400, at time $t_n$ the cavity is filled up to the flow front surface $\Gamma_{t_n}$. As shown further in FIG. 4, after a small time step $\Delta t$ the flow front surface $\Gamma_{t_n}$ to progresses to a flow front $\Gamma_{t_{n+1}}$ (at the time $t_{n+1}=t_n+\Delta t$). If $\Delta t$ is sufficiently small, a consistent pressure drop $\Delta p$ from surface $\Gamma_{t_n}$ and $\Gamma_{t_{n+1}}$ can be assumed at time $t_{n+1}$. Further, the distance from surface $\Gamma_{t_n}$ to $\Gamma_{t_{n+1}}$ near $e^i$ ($e^i$ is located in the band between surface $\Gamma_{t_n}$ and $\Gamma_{t_{n+1}}$ can be approximated by:

$$d_{t_n,t_{n+1}} = \overline{v}\cdot\Delta t = \Delta t \cdot \frac{H^2}{12\mu}\frac{\Delta p}{d_{t_n,t_{n+1}}}$$

where $\overline{v}$, H, and $\mu$ represent the average velocity, local thickness and viscosity of $e^i$ respectively. Accordingly, the average velocity of $e^i$ can be simplified to:

$$\overline{v} = \sqrt{\frac{H^2}{12\mu}\frac{\Delta p}{\Delta t}}$$

In other words, the average velocity of $e^i$'s can between the band of surfaces $\Gamma_{t_n}$ to $\Gamma_{t_{n+1}}$ during the time period from $t_n$ to $t_{n+1}$ is preportional to $H/\sqrt{\mu}$. Consequently, each $e^i$ can be given an average velocity scale (or dimensionless average velocity) of:

$$\overline{v}_s = \frac{\frac{H}{\sqrt{\mu}}}{\frac{\overline{H}}{\sqrt{\overline{\mu}}}}$$

where $\overline{H}$ is the average thickness of the model and $\overline{\mu}$ is a norminal viscosity of the molding material.

Continuing with the example of FIG. 4, a potential filling pattern can be determined based on assumptions derived for the model. A filling pattern can identify the position of the flow front at regular intervals as the cavity fills. Assuming that:

$$\Delta t = \frac{t_{injection}}{N}$$

where, $t_{injection}$ is the total time needed to fill the cavity, and that $\Delta t$ is very small, a series of N flow front surfaces $\Gamma_{t_n}$, n= 1 ... N can be derived, the series of flow surfaces representing the calculated fill pattern.

In some instances, the determined filling pattern can be graphically presented to a user to assist the user in appreciating the character of the calculated fill pattern. In one aspect, the computer graphic display of the filling pattern can be realized efficiently by grouping $e^i$'s in each band bounded by $\Gamma_{t_n}$ and $\Gamma_{t_{n+1}}$. Each $e^i$ can then be indexed to its corresponding band order. These band orders can serve as the filling order. In some implementations, this can be accomplished by first beginning at the cells (or $e^i$'s) at or around gate location, at t=0. Additional $e^i$'s can be added into the flow domain beginning from the gate and out toward a flow front. As $e^i$'s are added, the accumulated volume, $$V_f = \Sigma V^{e^i}$$

can be tracked, where $V^{e^i}$ is the volume of $e^i$. Additionally, each $e^i$ can have a flow-length parameter $L^{e^i}_f$ and a flow-path length parameter $L^{e^i}_{fp}$. For cells $e^i$'s at or around gate location, the flow-path length parameter can be set $L^{e^i}_f=0$ and $L^{e^i}_{fp}=0$. As cells $e^i$'s are added, the filling time parameter $t_f$ at the addition of a particular cell $e^i$'s can be calculated:

$$t_f = V_f/V_m$$

where $V_m$ is the total volume of that portion of the cavity to be filled in the simulation. Cells can be progressively added from the gate, simulating the materials flow through the cavity passages. Cells immediately outside the flow front (i.e., connected to the outermost cells within the flow domain, or cells $e^i$'s) can be designated as the next candidates to be added. The average velocity scale can be calculated, as well as the flow-length parameter of these outside cells:

$$L^{e^i}_f = \min_{e^j}\left(L^{e^j}_f + 2.0\cdot\frac{d_{i,j}}{\overline{v}^{e^i}_s + \overline{v}^{e^j}_s}\right)$$

where $e^j$'s are the close by filled cells and $d_{i,j}$ is the distance between $e^i$ and $e^j$. The flow-path length can also be calculated for the cells just outside the flow domain, as:

$$L_{fp}^{e^i} = \min_{e^j}\left(L_{fp}^{e^j} + d_{i,j}\right)$$

Among the set of cells $e^i$'s immediately outside the flow front, a particular cell $e^k$ can be identified having the smallest flow-length parameter. This particular cell can be selected as the first cell to be added to the flow domain from among the set of cells $e^i$'s immediately outside the flow front. In some instances, the addition of cell $e^k$ to the flow domain can add additional cells that are now immediately outside the revised flow front. Accordingly, the steps of determining current filling time $t_f$, the average velocity scale $\bar{v}$, flow-length parameter, and flow path length of the newly added $e^i$'s can be determined to identify the next $e^k$ to be added to the flow domain. These steps can be repeated until all cells $e^i$'s have been added to the domain.

Figure 5A:
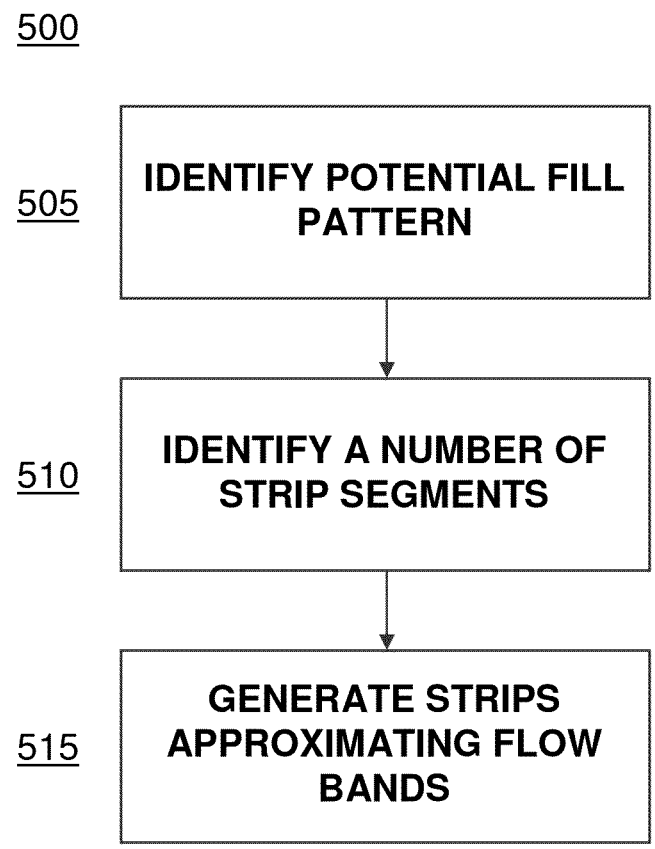
FIG. 5A is a flow-diagram of an example technique for generating a strip segment model for a three-dimensional mold cavity model.
Figure 5B:
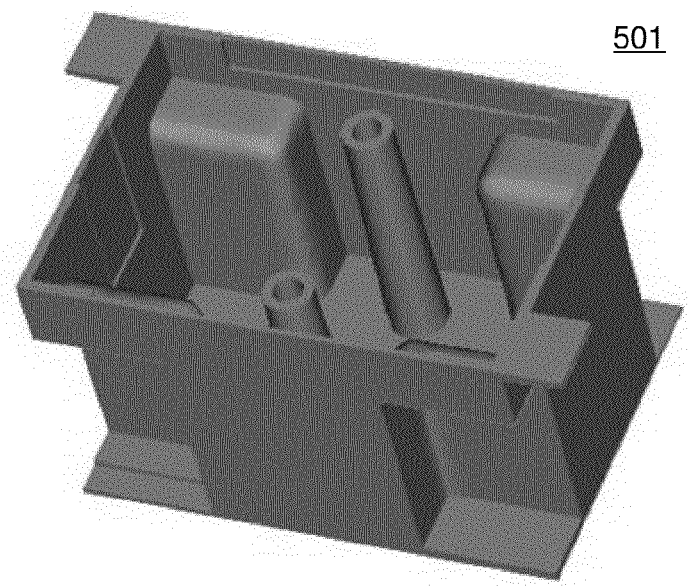
FIG. 5B illustrates an example injection mold cavity model modeled by a strip segment model.
Figure 5C:
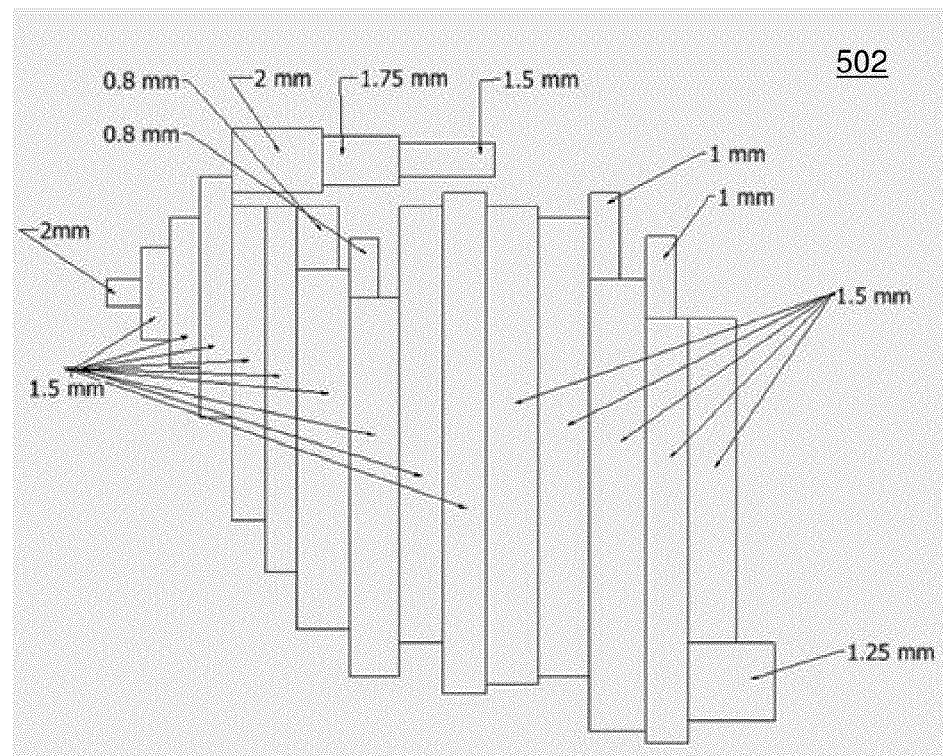
FIG. 5C illustrates an example strip segment model of the mold cavity model illustrated in FIG. 5B.

FIG. 5A is a flow-diagram 500 of an example technique for generating a strip segment model for a three-dimensional mold cavity model. By way of illustration, FIG. 5B shows an example mold cavity model 501 modeled by a generated strip segment model 502 shown in FIG. 5C. Returning to FIG. 5A, a strip segment model, such as strip segment model 502, can be generated by identifying 505 a potential fill pattern simulating the progression of a particular thermoplastic material injected into the particular mold cavity (e.g., 501). The potential fill pattern can identify a filling sequence for the material, the sequence identifying a plurality of flow bands corresponding to a series of time periods. Each flow band can include those cells in the mesh determined to be "filled" during the particular time period corresponding to the respective band (i.e., cells in between the flow front surfaces at the start and end of the corresponding time period). A particular number of strips can be identified 510 to be generated in the modeling of the three-dimensional mold cavity model. The number of strips can be equal to, be a multiple of, or otherwise correspond to the number of time intervals (and flow front surfaces and bands) included in the fill pattern. In some instances, the generation of the fill pattern can be based, at least in part, on the number of strips desired. Generally, the more strips that are included in a strip model, the more accurate the results of strip model simulations will be. A single strip can correspond to a single flow front band, more than one flow front band, or one or more portions of flow front bands identified in the identified fill pattern. Strips can be generated 515 that approximate the dimensions of flow front bands in the fill pattern. The strips can be substantially rectangular in geometry. As flow front bands can often be irregular in dimension, the flow front band can be flattened to form a simpler geometry, such as a rectangle, or C-shaped semicircle.

Figure 6A:
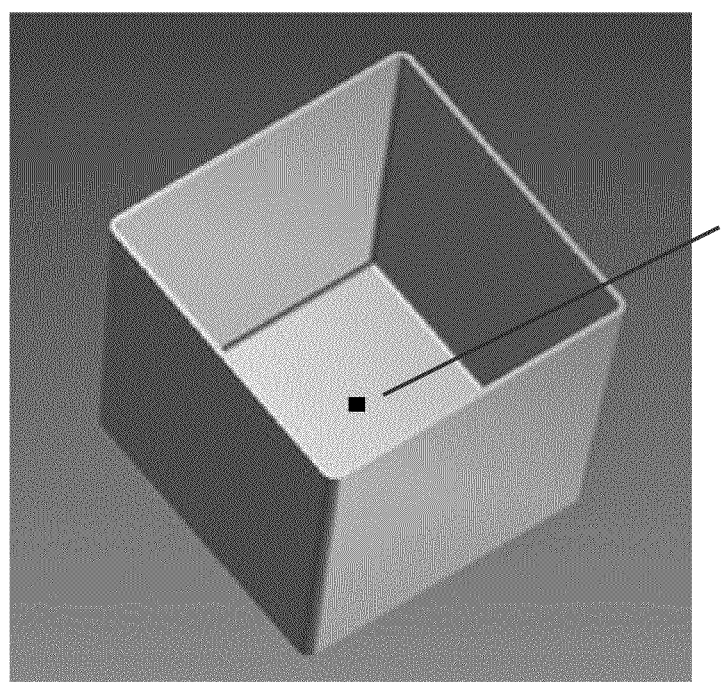
FIGS. 6A-6C illustrate development of an example strip segment model for a three-dimensional mold cavity model.
Figure 6B:
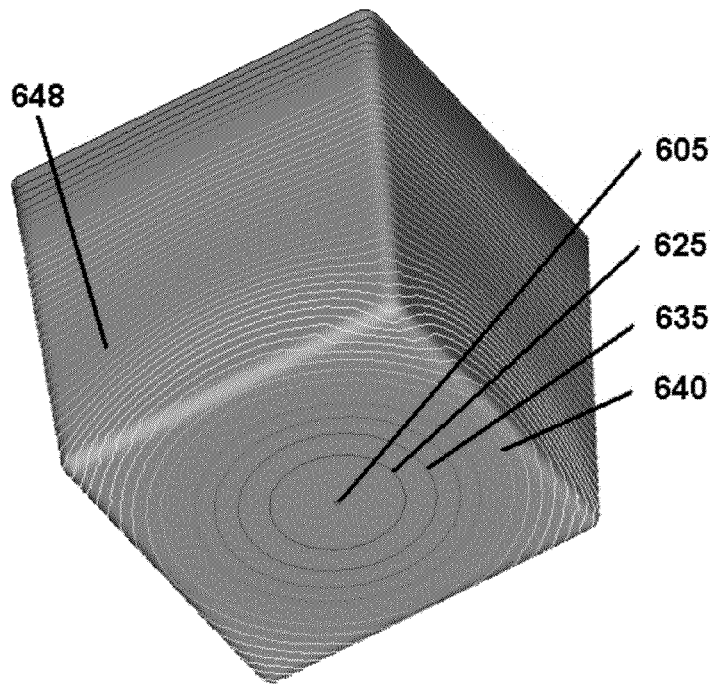
Figure 6C:
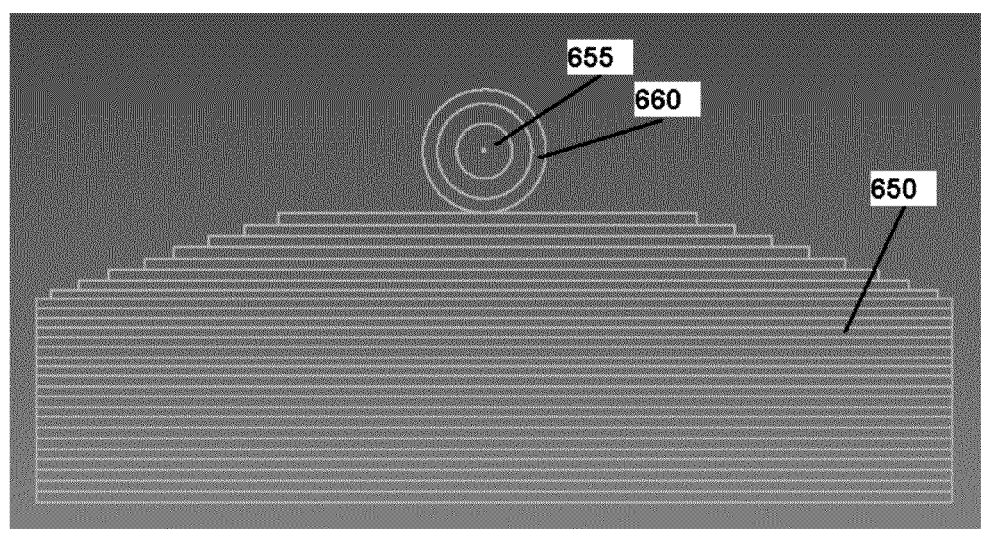

FIGS. 6A-6C illustrate the development of an example strip segment model for an example three-dimensional mold cavity model. For instance, FIG. 6A shows a representation of an example CAD mold cavity geometry 600. The mold cavity 600 can correspond to a complete mold cavity model or a subsection of a whole mold cavity model. In this particular example, the mold cavity is adapted for use in injection-mold production of a cubic box, or a hollow cube with an open face. In this simplified example, a potential gate 605 for the cavity 600 is located at the geometrical center of the surface of the cube opposite the opening. In some instances of an algorithm for generating a strip segment model for the modeled mold cavity 600, a potential fill pattern can be identified 505. For instance FIG. 6B shows a potential fill pattern simulating the progression of a particular thermoplastic material injected into mold cavity 600.

A set of flow pattern fronts (e.g., 625, 635, 640) can be anticipated based on the location of the gate 605 of the mold cavity 600. The set of flow fronts can be, incorporate, or otherwise correlate with a set of flowfronts determined from a previously-generated simulated potential flow pattern, such as the potential flow patterns generated according to the algorithms and techniques described above. Each flow front (e.g., 625, 635, 640) can represent the anticipated progress of fluid flow within the cavity. For instance, at t=0.1, progress of fluid injected in the mold cavity can be anticipated to be at the flow front 625. Further, at t=0.6, fluid injected in the mold cavity can be anticipated to progress to flow front 640, and so on.

A set of strip segments can be generated to build a strip segment model of a mold cavity based on a set of flow fronts identified for a particular three-dimensional mold cavity model, such as those shown and described in connection with the example of FIG. 6B. As shown in FIG. 6C, a set of strip segments can be based on a set of flow fronts identified for a mold cavity model, such as from a previously-generated potential flow front pattern based on a mesh of the mold cavity model. As shown in FIG. 6C, the incremental flow between two consecutive flow fronts can define a flow band (e.g., 648). A set of strips can be identified that correlate with each flow band in a determined flow pattern model. As flow bands will often be irregular, generation of a correlating strip segment from a flow band can involve a flattening step, that identifies a simple geometric shape approximating the shape and dimensions of the flow band. For instance, flow band 648, shown in FIG. 6B can be flattened and approximated as a simple rectangular strip 650. In some instances, it can be advantageous to flatten a flow band to a simplified strip segment geometry, as flow analyses of simplified geometries can be quickly and simply calculated (particularly with modern computing resources) while providing a fairly reliable approximation of flow within the more complex geometry of the flow band modeled by the strip segment. In addition, flow bands in a strip segment set can adopt varying geometries, such as circular segments 655 and arcuate segments 660, as shown in FIG. 6C.

One or more computers can be employed to generate a strip segment model according to a fill pattern flow domain for a three-dimensional CAD mold cavity model. A computer-generated fill pattern model itself can be used to determine how the mold cavity model can be "cut" into strip segments, or "flow strips." Additionally, in instances where a flow model is based on a mesh of cells or voxels, meshed cells can be mapped onto the generated strip segments based on the fill patterns of the flow model incorporating the cell mesh and a few quality control criteria's. Based on a desirable number $N_s$ of strip segments to be included in the strip segment model, a criteria of maximum volume value $V_{max}^s$ can be determined for strip segments in the model, where $V_{max}^s = V_m/N_s$ and $V_m$ is the total volume of the modeled cavity. A threshold maximum segment length for a strip segment $L_{fp_{max}}^s$ can also be determined, such as:

$$L_{fp_{max}}^s = 2 \cdot \overline{H}$$

Cells $e^i$'s can be indexed according to the order in which they were added to the flow domain during generation of the fill pattern model. This index, and sequence recorded by the index, can be used in the generation of strip model segments. For instance, cells added earlier to the flow domain can be added to a particular strip segment in the strip model before cells added later in the flow domain. In other instances, strip segments can be generated substantially simultaneous with the generation of a potential fill pattern model for the corresponding 3D mold cavity, with cells being added to strip segments at the same time corresponding cells are added to the flow domain of the potential fill pattern. Further, cells can be added to the strip segment until the strip segment is determined to be full, or until the strip segment meets certain other criteria. Generation of another strip segment can then begin and cells added to the new strip segment until yet another strip segment is ready for generation. This can continue until a set of $N_s$ strips are generated.

As cells $e^j$'s are added to a strip segment $S^i$, the dimensions of the strip segment can grow. Determining that a particular strip segment is full can be based on a determination that a particular dimensional threshold has been met for the strip segment. For instance, when a new strip segment begins, it can have a start flow-path-length $L_{fp}^s = L_{fp}^c$. $L_{fp}^c$ can correspond to current flow-path-length (i.e. the flow path length of fluid travel from a gate location to current location) as well as the end flow-path-length of the immediately preceding strip segment (e.g., a strip segment corresponding to a fill pattern band of a time interval ending at the beginning of the time interval of the fill pattern band upon which a currently generated strip segment is based). Further, as generation of the new strip segment $S^i$ begins, segment volume $V^{s^i}=0$ and volume thickness $VH^{s^i}=0$. As cells $e^j$'s are added to and accumulate in a particular strip segment $S^i$, the dimensions of the strip segment can grow accordingly. For instance:

$$V^{S^i} = \sum_{e^j \in S^i} V^{e^j}$$

$$VH^{S^i} = \sum_{e^j \in S^i} V^{e^j} \cdot H^{e^j}.$$

Additionally, the expanding $L_{fp}^c$ can be set to:

$$L_{fp}^c = \max(L_{fp}^c, L_{fp}^{e^i}).$$

In instances where $L_{fp_{max}}^s$ and $V_{max}^s$ are set, the progression of $L_{fp}^c$ and $V^{s^i}$ can be checked after the addition of each cell $e^j$ to ensure that $L_{fp}^c < L_{fp}^s + L_{fp_{max}}^s$ and $V^{S^i} < V_{max}^s$. If this is true, in some aspects, cells $e^j$'s can continue to be added to the current strip segment, otherwise the current strip segment can be "closed" to the addition of new cells $e^j$'s, with new cells being added to a new strip segment. The new strip segment can have dimensions of:

$$H^{S^i} = VH^{S^i}/V^{S^i}$$

$$L^{S^i} = L_{fp}^c - L_{fp}^s$$

$$W^{S^i} = V^{S^i}/(L^{S^i} \cdot H^{S^i})$$

$$L_f^{S^i} = L_f^{e^n}$$

where $L^{S^i}$ is the length (i.e., dimension in flow direction) of the strip segment $S^i$, $W^{S^i}$ is the strip segment width (i.e., dimension perpendicular to the flow direction), and $H^{S^i}$ is the thickness of the strip segment $S^i$ (i.e., the average thickness of all cells added to this strip segment, $H^{S^i} \cdot L^{S^i} \cdot W^{S^i} \equiv V^{S^i} = \Sigma_{e^j \in S^i} V^{e^j}$). $L_f^{S^i}$ is the end flow-length parameter of the strip segment, and $e^n$ is the final cell $e^j$ added to this strip segment $S^i$. The strip segment flow-length parameter $L_f^{S^j}$ can be used to map strip flow analysis results (based on the resulting strip segment model) back to the original model. Mapping can be carried-out through linear interpolation. As every cell $e^i$ has a flow-length parameter $L_f^{e^i}$ the flow-length parameter can be used as a linear coordinate that can be used to interpolate $e^i$'s result value:

$$R^{e^i} = \frac{(L_f^{S^j} - L_f^{e^i})R^{S^{j-1}} + (L_f^{e^i} - L_f^{S^{j-1}})R^{S^j}}{(L_f^{S^j} - L_f^{S^{j-1}})},$$

where $e^i$ belongs to segment $S^j$ and $R^{S^j}$ is a result at the end of segment $S^j$. The generation of new strip segments, and the mapping of mesh elements, or cells, to the strip segment can continue until all cells in the mesh model are added to a strip segment and/or when the set of strip segments has been fully generated.

A simplified strip segment model, such as one generated according to steps and equations described in some of the examples above, can be quickly generated using a computing device. A strip analysis can be performed on the strip segment model to estimate various performance characteristics of injection molding within the mold cavity, as modeled by the strip segments. For instance, given the simple geometry of the strip segments, a computing device can quickly calculate characteristics and parameters of the simulated injection molding such as the pressure required to fill mold cavity, pressure distribution at the end of filling stage, temperature distribution of material within the cavity immediately after or during filling, and injection molding tonnage. A strip analysis can further predict potential benefits, defects, and other features of a particular mold cavity design, such as short shot, weld line and air trap locations, flow hesitation, sink marks, and cavity balance. Additionally, results of a strip model analysis can be mapped back to the original CAD mold cavity modeled by the strip segment model to provide the user with a graphical representation of the strip analysis estimates. For instance, a GUI can present the CAD cavity model shaded according to, for example, temperature distribution, or pressure distribution across the cavity.

As noted above, using the techniques described in connection with FIGS. 2-6D, a simplified strip segment model can be quickly created by one or more computing devices and various analyses can be performed on the simplified strip model. In some instances, the building of a strip model, including the generation of a potential fill pattern model, can be completed in less than one second. Using a 4 GB personal computer utilizing an Intel i7 CPU, a voxel mesh can be generated at speeds exceeding 1,000,000 cells/s. The mesh can be prepared for analysis with speeds exceeding 1,000,000 cells/s. Further, identifying a potential fill pattern, building a corresponding strip model, and executing at least one analysis on the strip model can be completed at speeds exceeding 1,000,000 cells/s. In some instances, it is desirable to partition a 3D mold cavity into at least one half of a million cells. Quick simulations and analyses, based on such speeds, can allow for iterative analyses using multiple potential strip segment models that correspond, for example, to multiple respective mold cavity design alternatives. For instance, a quick simulation tool can quickly generate multiple strip segment models corresponding to multiple design alternatives and conduct comparative performance analyses on each strip segment model to provide the user with an indication of which alternative is most optimum. As examples, iterative or concurrent analyses on multiple strip segment models can be conducted to determine an optimum gate location, optimum material injection rate, optimum cavity balance, or optimum filling time for a particular cavity design.

In some instances, a strip segment model can be generated as the user designs and modifies a particular three-dimensional CAD mold model. For instance, as shown in the flowchart 700 of FIG. 7, a user input can be received 705 that identifies a modified characteristic for the CAD model. The user input can be, or otherwise relate to, user inputs within a CAD design environment entered for the purpose of modifying the dimensions, gate layout, geometry, or other characteristic of the CAD model. In some instances, the user input can be a query identifying a hypothetical modification of the CAD model. For instance, a user can interact with a CAD mold cavity model to, for example, explore the effect and/or feasibility of one or more design choices, such as hypothetical locations, types, or orientations for a gate, runner, and/or cavity void (e.g., part thickness), in the mold cavity model. The user input, or interaction, with the CAD model can correspond to an interaction with a graphical representation of the CAD model, such as a mouse click or hover over a particular element or location on the CAD model. Upon identifying 705 a user input identifying an actual or hypothetical modification of a characteristic of the CAD model, an updated potential fill pattern can be determined 710 based at least in part on the modified characteristic. The updated potential fill pattern can be determined 710 using the same or similar techniques and algorithms used to determine (e.g., 215) an original or earlier potential fill pattern for the CAD model, including the techniques and algorithms described above. Further, an updated strip model can be generated 715 based at least in part on the updated potential fill pattern. In some instances, the updated strip model can be generated using the same or similar techniques and algorithms used to generate (e.g., 220, FIG. 5 and accompanying description) an original or earlier strip segment model for the CAD model, including the techniques and algorithms described above. Another strip model analysis can then be performed 720 using the updated strip model. Results of the strip analysis on the updated strip model can be presented to the user. In some instances, the results of the update strip model analysis can include how the results of the updated analysis differ from or compare to results from other analyses performed on earlier or other strip models. In some instances, iterative or concurrent strip analyses can be performed on multiple alternative strip models, for example, to model and compare the effects of various alternative design choices. Comparative analysis results can similarly be generated and presented to the user for strip analyses of alternative strip models.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. For instance, in certain implementations, multitasking, parallel processing, and cloud computing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. Accordingly, other embodiments are within the scope of the following claims.

What is claimed is:

1. A computer-implemented method comprising:
   identifying a three-dimensional CAD model representing an injection mold cavity, including a location for at least one gate;
   determining a potential fill pattern for a material injected into the injection mold cavity based at least in part on geometry and dimensions of the modeled mold cavity and the location of the at least one gate;
   generating a strip model of the CAD model based at least in part on the determined fill pattern; and
   using the strip model to perform a strip analysis simulating injection of the material within the injection mold cavity.

2. The method of claim 1, further comprising:
   determining at least one simulation result based on the strip analysis; and
   providing the at least one simulation result to a user.

3. The method of claim 2, wherein the at least one simulation result is mapped onto the three-dimensional CAD model.

4. The method of claim 2, wherein the at least one simulation result includes at least one of a filling pattern of the injection mold cavity as a function of time, a pressure requirement for filling the injection mold cavity, a pressure distribution across the injection mold cavity following injection of the material in the injection mold cavity, a distribution of material temperature as the material entered the injection mold cavity, potential weld line location, potential air trip location, flow hesitation, or injection molding tonnage.

5. The method of claim 1, further comprising identifying a partitioning of the CAD model, the partitioning including a plurality of interconnected, three-dimensional cells that partition an interior volume of the CAD model, the interior volume corresponding to the injection mold cavity, wherein the potential fill pattern is determined based at least in part on the dimensions and orientations of the plurality of three-dimensional cells.

6. The method of claim 5, wherein the potential fill pattern includes a filling sequence identifying a series of flow bands corresponding to a series of time intervals, wherein each flow band includes those cells in the plurality of three-dimensional cells filled with the material after the corresponding time interval.

7. The method of claim 6, wherein generating a strip model includes:
identifying a number of strip segments for use in approximating a flow domain corresponding to the interior volume; and
assigning interconnected cells in the plurality of cells to each strip segment according to the filling sequence, interconnected cells included in flow bands corresponding to earlier time intervals assigned to a particular strip segment prior to other cells included in flow bands corresponding to later time intervals, wherein strip segments are assigned interconnected cells until populated.

8. The method of claim 7, further comprising:
determining a maximum volume for each strip segment; and
determining at least one maximum segment dimension for each strip segment;
wherein a strip segment is determined to be populated when strip segment volume reaches the determined maximum volume or strip segment flow path length reaches the maximum segment flow path length.

9. The method of claim 5, wherein the plurality of cells include voxels.

10. The method of claim 5, wherein determining the potential fill pattern includes:
determining local thickness of each cell in the plurality of cells,
performing a Hele-Shaw flow analysis of the interior volume based at least in part on the local thicknesses of the plurality of cells.

11. The method of claim 1, further comprising determining at least one of an optimized location of the gate, optimized filling duration, or optimized cavity balance based at least in part on the strip analysis.

12. The method of claim 1, further comprising predicting at least one mold cavity defect based at least in part on the strip analysis.

13. The method of claim 1, further comprising:
receiving a user input identifying a modified characteristic for the CAD model;
determining an updated potential fill pattern for a version of the CAD model possessing the modified characteristic;
generating an updated strip model based at least in part on the updated potential fill pattern; and
performing a second strip analysis using the updated strip model.

14. The method of claim 13, wherein determining the updated potential fill pattern and generating the updated strip model are performed in response to the received user input.

15. The method of claim 13, further comprising providing, to a user, analysis results of the second strip analysis, the analysis results identifying injection molding performance differences resulting from the modification of the characteristic.

16. The method of claim 13, wherein the modified characteristic includes at least one of the location of the gate, mold cavity geometry, or mold cavity dimensions.

17. A system comprising:
a user interface device;
a machine-readable storage device including a program product; and
one or more processors operable to execute the program product, interact with the user interface device, and perform operations comprising:
identifying a three-dimensional CAD model representing an injection mold cavity, including a specified location for at least one gate;
determining a potential fill pattern for a material injected into the injection mold cavity based at least in part on geometry and dimensions of the modeled mold cavity and the location of the at least one gate;
generating a strip model of the CAD model based at least in part on the determined fill pattern; and
using the strip model to perform a strip analysis simulating injection of the material within the injection mold cavity.

18. The system of claim 17, wherein the one or more processors comprise a server operable to interact with the user interface device through a data communication network, and the user interface device is operable to interact with the server as a client.

19. The system of claim 17, wherein the user interface device comprises a personal computer.

20. The system of claim 17, wherein the one or more processors comprise one personal computer, and the personal computer comprises the user interface device.

21. The system of claim 17, wherein the program product includes a CAD design tool integrated with a quick injection mold simulation tool.

22. A non-transitory computer program product, encoded on a computer-readable medium, operable to cause data processing apparatus to perform operations comprising:
identifying a three-dimensional CAD model representing an injection mold cavity, including a location of at least one gate;
determining a potential fill pattern for a material injected into the injection mold cavity based at least in part on geometry and dimensions of the modeled mold cavity and the location of the at least one gate;
generating a strip model of the CAD model based at least in part on the determined fill pattern; and
using the strip model to perform a strip analysis simulating injection of the material within the injection mold cavity.

* * * * *

UNITED STATES PATENT AND TRADEMARK OFFICE
CERTIFICATE OF CORRECTION

PATENT NO. : 8,463,584 B2
APPLICATION NO. : 12/874949
DATED : June 11, 2013
INVENTOR(S) : Huagang Yu Page 1 of 1

It is certified that error appears in the above-identified patent and that said Letters Patent is hereby corrected as shown below:

In the Claims

In Claim 22, column 18, line 41, before "computer program" delete -- non-transitory --.

In Claim 22, column 18, line 42, before "computer-readable" insert -- non-transitory --.

Signed and Sealed this
Seventeenth Day of September, 2013

Teresa Stanek Rea
*Deputy Director of the United States Patent and Trademark Office*